United States Patent
Bradley et al.

(10) Patent No.: US 9,176,174 B1
(45) Date of Patent: Nov. 3, 2015

(54) SYSTEMS AND METHODS FOR SIMULTANEOUSLY MEASURING FORWARD AND REVERSE SCATTERING PARAMETERS

(71) Applicant: ANRITSU COMPANY, Morgan Hill, CA (US)

(72) Inventors: Donald Anthony Bradley, Morgan Hill, CA (US); Karam Michael Noujeim, Los Altos, CA (US); Jon S. Martens, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 81 days.

(21) Appl. No.: 14/213,171

(22) Filed: Mar. 14, 2014

Related U.S. Application Data (60) Provisional application No. 61/798,859, filed on Mar. 15, 2013.

(51) Int. Cl.
  *G01R 27/28* (2006.01)
  *G01R 31/00* (2006.01)
  *G01R 31/319* (2006.01)

(52) U.S. Cl.
  CPC .......... *G01R 27/28* (2013.01); *G01R 31/31924* (2013.01)

(58) Field of Classification Search
  CPC .................. G01R 27/28; G01R 31/31924
  USPC .................... 324/612, 617, 750.1
  See application file for complete search history.

(56) References Cited

U.S. PATENT DOCUMENTS

2012/0326737 A1* 12/2012 Wen .................. 324/750.01

* cited by examiner

*Primary Examiner* — Jermele M Hollington
*Assistant Examiner* — Farhana Hoque
(74) *Attorney, Agent, or Firm* — Tucker Ellis LLP (57) ABSTRACT

A system adapted to measure electrical performance of a device under test (DUT) having two or more ports includes a plurality of signal sources synchronized and configured to generated signals simultaneously, a plurality of first signal paths to obtain transmitted and reflected signals from the DUT, a plurality of second signal paths to obtain incident signals from the signal sources, and a receiver for receiving the reflected, transmitted and incident signals obtained at the first signal paths and the second signal paths. The receiver is adapted to separate the reflected and the transmitted signals obtained from each of the first signal paths. The signal sources are configured to each generate a signal having a frequency offset from each of the others of the signal sources by a known frequency delta.

20 Claims, 13 Drawing Sheets

SYSTEMS AND METHODS FOR SIMULTANEOUSLY MEASURING FORWARD AND REVERSE SCATTERING PARAMETERS

CLAIM OF PRIORITY

This application claims the benefit of priority to U.S. Provisional Application titled "SYSTEMS AND METHODS FOR SIMULTANEOUSLY MEASURING FORWARD AND REVERSE SCATTERING PARAMETERS", Application No. 61/798,859, filed Mar. 15, 2013, which application is herein incorporated by reference.

TECHNICAL BACKGROUND

The present invention relates to vector network analyzers and use of vector network analyzers to generate scattering parameters in a device under test.

BACKGROUND

Scattering (S-) parameters (the elements of a scattering matrix or S-matrix) describe the electrical behavior of linear electrical networks when undergoing various steady state stimuli by electrical signals. The parameters are useful for electrical engineering, electronics engineering, and communication systems design, and in particular for microwave engineering.

Scattering refers to the way in which the traveling currents and voltages in a transmission line are affected when they meet a discontinuity caused by the insertion of a network into the transmission line. For example, the affect on a wave that meets an impedance differing from the characteristic impedance of a line. S-parameters can be used to express electrical properties of networks of components (e.g., inductors, capacitors, resistors). Such electrical properties can include gain, return loss, voltage standing wave ratio (VSWR), reflection coefficient and amplifier stability.

SUMMARY

In an embodiment, a system adapted to measure electrical performance of a device under test (DUT) having two or more ports includes a plurality of signal sources synchronized and configured to generated signals simultaneously, a plurality of first signal paths to obtain transmitted and reflected signals from the DUT, a plurality of second signal paths to obtain incident signals from the signal sources, and a receiver for receiving the reflected, transmitted and incident signals obtained at the first signal paths and the second signal paths. The receiver is adapted to separate the reflected and the transmitted signals obtained from each of the first signal paths. The signal sources are configured to each generate a signal having a frequency offset from each of the others of the signal sources by a known frequency delta.

In an embodiment, the system includes a signal processor configured to calculate scattering parameters from the reflected, transmitted and incident signals received by the receiver. In an embodiment, the signal processor is a digital signal processor, and the system further includes an analog-to-digital convertor for converting each of the reflected, transmitted and incident signals received by the receiver for processing by the digital signal processor. In an embodiment, the digital signal processor is configured to simultaneously calculate scattering parameters via parallel processing.

In an embodiment, each signal source connectable with an associated port of the two or more ports of the DUT, each first signal path is connectable with an associated port for obtaining reflected and transmitted signals simultaneously received from the DUT at the associated port, and each second signal path is connectable with an associated port for obtaining incident signals received from the signal source connected with the associated port.

In an embodiment, each of the signal sources is a multi-harmonic signal source adapted to step through multiple harmonics when generating a signal. The stepping though of the multiple harmonics of the signal sources is synchronized. In an embodiment, the system includes a signal processor configured to calculate scattering parameters from the reflected, transmitted and incident signals received by the receiver for each of the multiple harmonics stepped through.

In an embodiment, the receiver includes a downconversion stage and a filter stage. The reflected signals and the transmitted signals can be separated in the filter stage. In an embodiment, the downconversion stage includes a mixer for each of the first and the second signal paths. In an embodiment, the downconversion stage includes a plurality of local oscillators, wherein each local oscillator is associated with the first signal path and the second signal path associated with a port of the two or more ports of the DUT.

In an embodiment, the system can generate, based on reflected, transmitted and incident signals received from the two or more ports, one or more of a scattering parameters, one or more eye diagrams, rise and fall time measurements, deterministic jitter measurements, compliance with a given eye mask, and approximate bit-error rate (BER) estimated from an eye diagram.

In an embodiment, a method for measuring electrical performance of a device under test (DUT) having two or more ports includes using a system in accordance with an embodiment of the present invention to simultaneously generate synchronized signals via a plurality of signal sources, transmit the simultaneously generated synchronized signals to the DUT, obtain transmitted and reflected signals from the DUT and incident signals from the signal sources, receive the transmitted, reflected and incident signals at a receiver, and measure electrical performance based on the transmitted, reflected and incident signals received by the receiver. Each synchronized signal has a frequency offset from each of the others of the synchronized signals by a known frequency delta.

In an embodiment, the method uses signal sources configured to generate multi-harmonic signals and steps through multiple harmonics of signals generated by the signal sources. The stepping through is synchronized across the signal source.

In an embodiment, the method calculates, via a signal processor, scattering parameters from the reflected, transmitted and incident signals received by the receiver. In embodiment the signal processor is a digital signal processor, and the method further includes converting, via an analog-to-digital convertor, each of the reflected, transmitted and incident signals received by the receiver for processing by the digital signal processor. In an embodiment, the method includes simultaneously calculating, via parallel processing, scattering parameters from the reflected, transmitted and incident signals received by the receiver.

In an embodiment, the receiver includes a downconversion stage and a filter stage and the method includes separating simultaneously received reflected signals and the transmitted signals via the filter stage. In an embodiment, the method includes down-converting each of the obtained transmitted, reflected and incident signals to an intermediate frequency.

In an embodiment the method includes generating, based on reflected, transmitted and incident signals received from the two or more ports, one or more of a scattering parameters, one or more eye diagrams, rise and fall time measurements, deterministic jitter measurements, compliance with a given eye mask, and approximate bit-error rate (BER) estimated from an eye diagram.

In an embodiment, a non-transitory computer readable storage medium, includes instructions stored thereon which when read and executed by one or more computers cause the one or more computers to perform the steps of embodiments of methods in accordance with the present invention.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

It would be apparent to one of skill in the art that the present invention, as described below, may be implemented in many different embodiments of hardware, software, firmware, and/or the entities illustrated in the figures. Any actual software, firmware and/or hardware described herein is not limiting of the present invention. Thus, the operation and behavior of the present invention will be described with the understanding that modifications and variations of the embodiments are possible, given the level of detail presented herein.

Figure 1A:
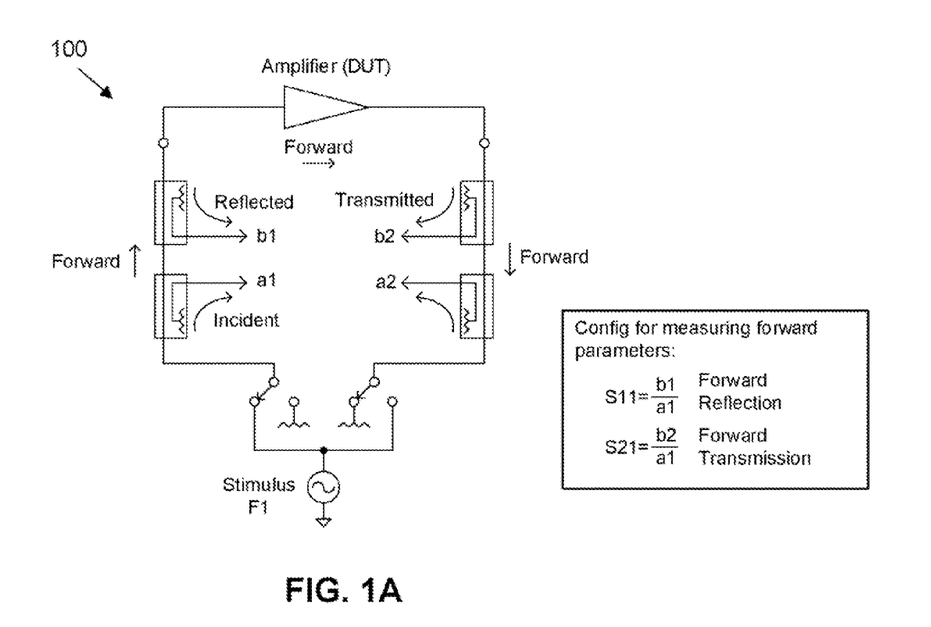
FIG. 1A is a block diagram of a vector network analyzer circuit for measuring forward scattering parameters.
Figure 1B:
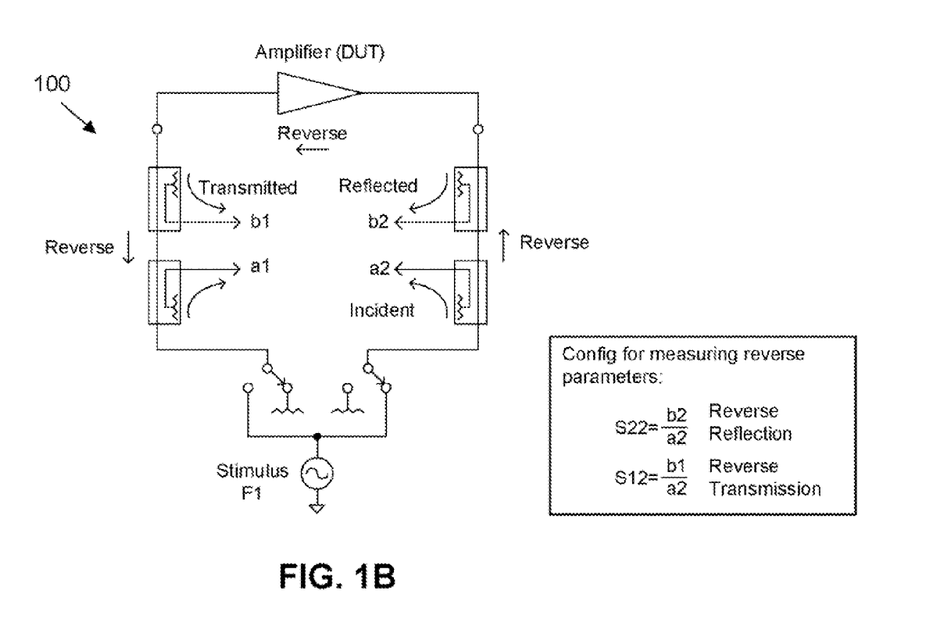
FIG. 1B is a block diagram of a vector network analyzer circuit for measuring reverse scattering parameters.

Scattering (S-) parameters can be obtained using a vector network analyzer (VNA) by generating a test signal F1 and transmitting the test signal to a device-under-test (DUT), which generates scattering parameters (S-parameters) which are reflected back to a receiver. Referring to FIGS. 1A and 1B, circuit diagrams of a system 100 for measuring S-parameters for a DUT, such as a two-port network, is shown. The system 100 allows full reversing measurements of forward and reverse scattering parameters by switching a stimulus into one port for forward measurements (FIG. 1A) and then switching the stimulus into the other port for reverse measurements (FIG. 1B). The stimulus switch redirects energy into the output of the DUT while terminating the input.

The system couples reflected, incident and transmitted signals to a receiver to measure four S-parameters (S11, S21, S22, S12) for a two-port DUT, for example. The forward reflection (S11) parameter is determined from a coupled reflected signal (b1) and incident signal (a1) obtained with the circuit switched to measure forward parameters (FIG. 1A) and the forward transmission (S21) parameter is determined from a coupled transmitted signal (b2) and the incident signal obtained with the circuit switched to measure forward parameters. The reverse reflection (S22) parameter is determined from a coupled reflected signal (b2) and incident signal (a2) obtained with the circuit switched to measure reverse parameters (FIG. 1B) and the reverse transmission (S12) parameter is determined from a coupled transmitted signal (b1) and the incident signal obtained with the circuit switched to measure reverse parameters.

The four s-parameters are then manipulated with calibration data to represent corrected s-parameter(s). The two pass approach can cause a delay in the displayed results. Gains in measurement update speed have made this delay acceptable at the cost of extensive hardware expense.

Figure 2A:
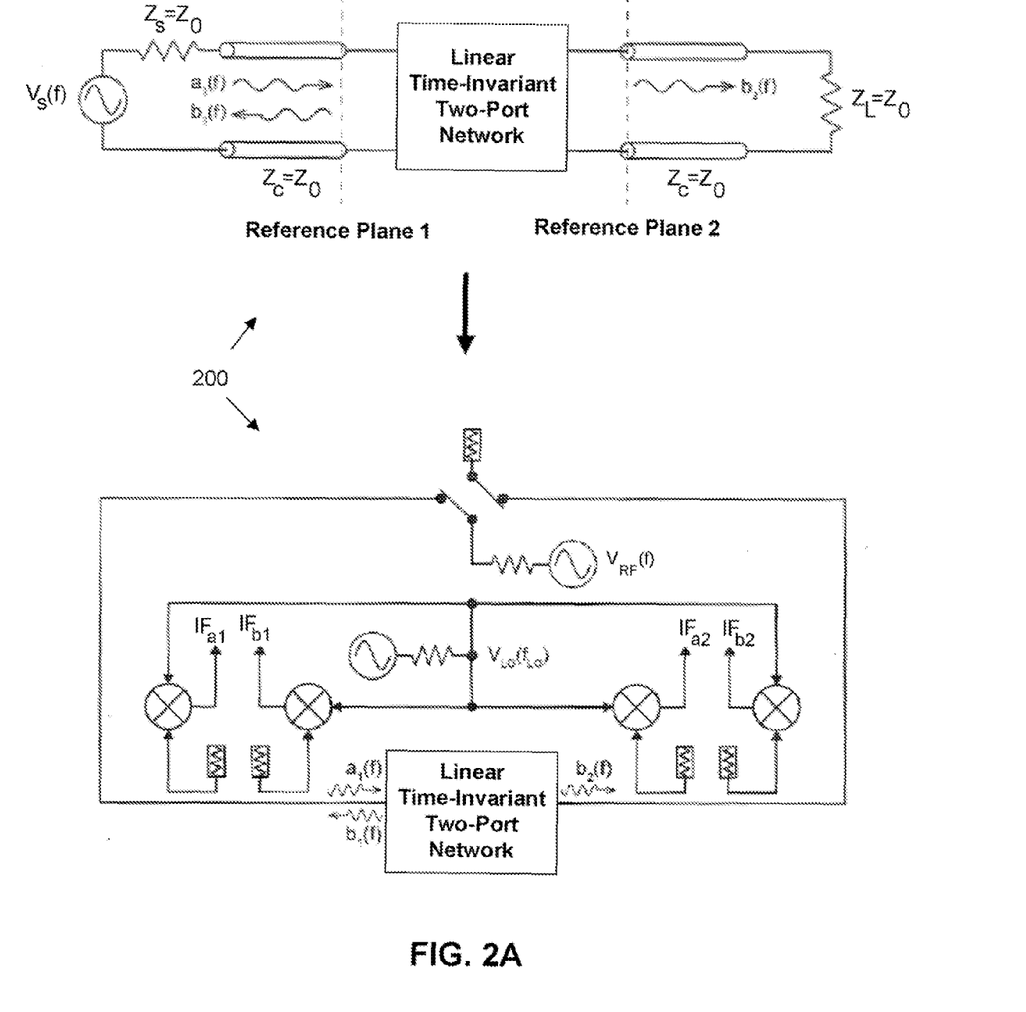
FIG. 2A is a further block diagram of a vector network analyzer circuit for measuring forward scattering parameters.
Figure 2B:
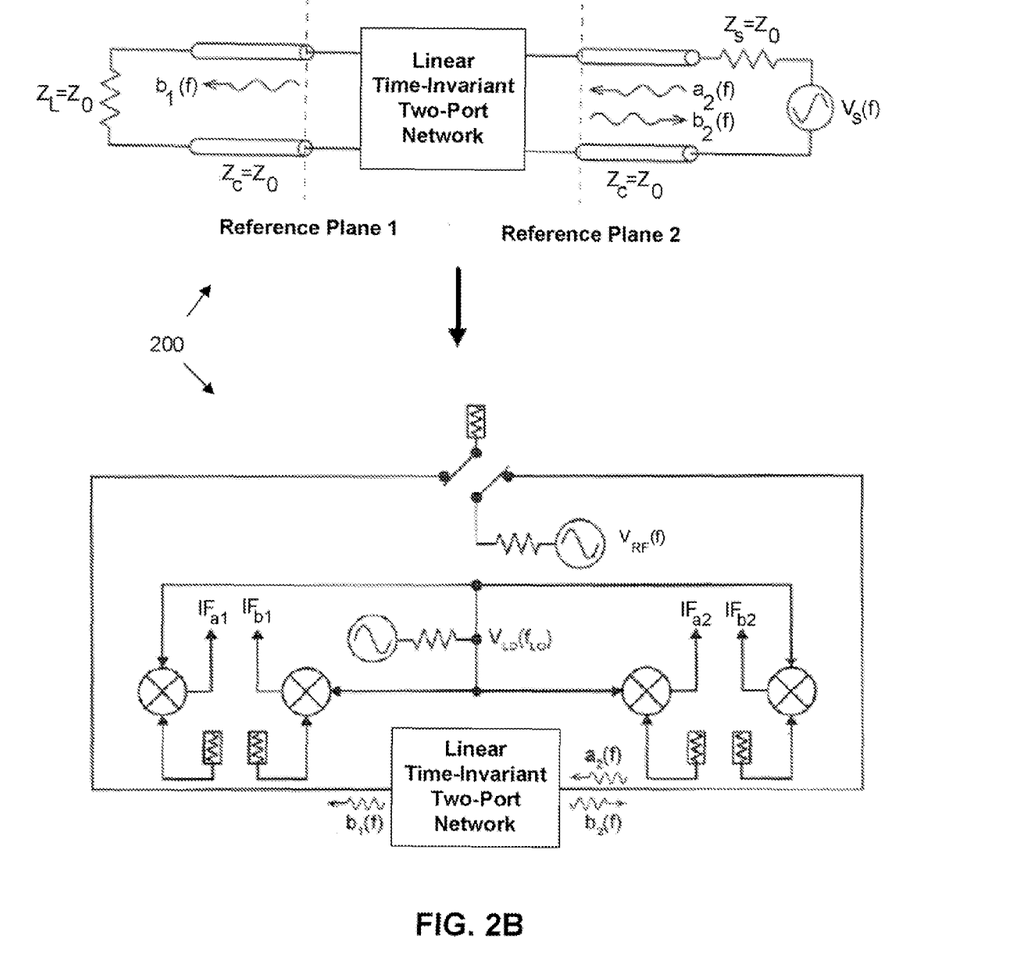
FIG. 2B is a block diagram of a vector network analyzer circuit for measuring reverse scattering parameters.

FIGS. 2A and 2B illustrate an alternative system 200 represented with different circuit diagrams that uses the same approach as the system 100 shown in FIGS. 1A and 1B. As shown in FIG. 2A, the system is switched to measure forward parameters. A radio frequency (RF) signal generated at a signal source ($V_{RF}$) is transmitted to a DUT and transmitted (b2), reflected (b1) and incident (a1) signals are coupled to the system. The coupled signals are downconverted to intermediate frequency signals ($IF_{a1}$, $IF_{b1}$, $IF_{b2}$) using a local oscillator (LO) signal generated by a local oscillator ($V_{LO}$). As shown in FIG. 2B, the system is switched to measure reverse parameters. A RF signal generated at the signal source is transmitted to a DUT and transmitted (b1), reflected (b2) and incident signals (a2) are coupled to the system 200. The coupled signals are downconverted to intermediate signals ($IF_{a2}$, $IF_{b1}$, $IF_{b2}$) using a LO signal generated by the local oscillator.

Embodiments of systems and methods in accordance with the present invention can be used to double the update speed of S-parameter measurements through simultaneous measurement of forward and reverse S-parameters in a device-under-test (DUT). A DUT can include an electrical network, a device, and/or a series of devices, for example that comprise a portion of an electrical network. Embodiments of systems and methods in accordance with the present invention further allow measurement of S-parameters across multiple harmonics and multiple ports.

Figure 5:
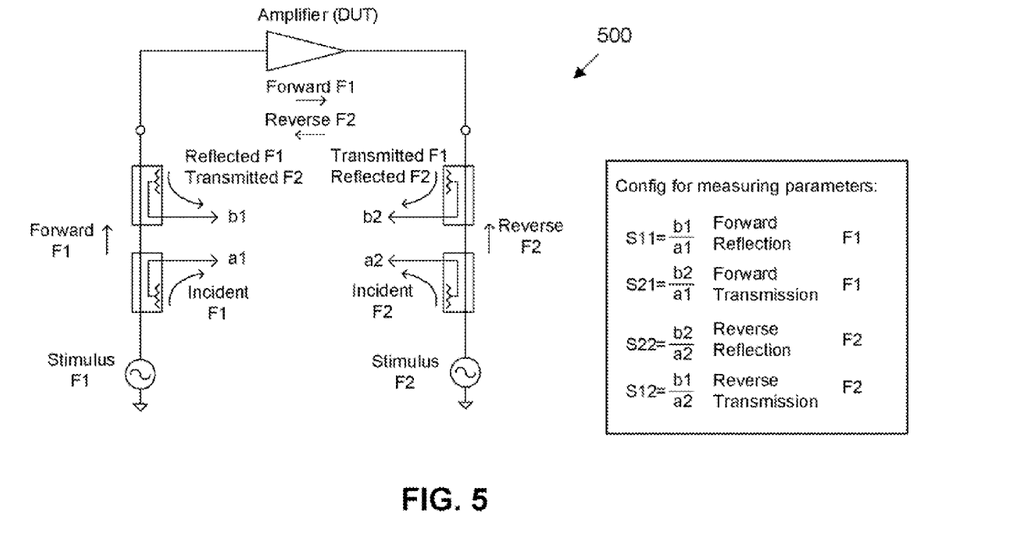
FIG. 5 is a block diagram of a system for measuring scattering parameters in accordance with an embodiment.

Referring to FIG. 5, an embodiment of a system 500 is shown generating both forward and reverse stimulus at the same time for measuring S-parameters for a DUT, such as a two-port network. As can be seen, the stimulus switch is removed. The two stimulus frequencies are offset by a delta F, allowing all four S-parameters to be present simultaneously. Frequency offset interpolation is used to re-align the two sets of measurements. The inventors have obtained unexpected results with the invention, including no switch losses or isolation problems, and the ability to measure active components under full operating power. Reverse parameters more realistically represent operational conditions with the switch insertion losses as well as isolation problems being omitted. This can be explained by taking an amplifier as an example. Referring to FIG. 1B, traditional reverse measurements are taken with the amplifier input terminated. In the system of FIG. 5, the amplifier will be fully engaged with input stimulus. This allows the system to obtain a set of reverse parameters useful for power matching of the amplifier output.

Figure 6:
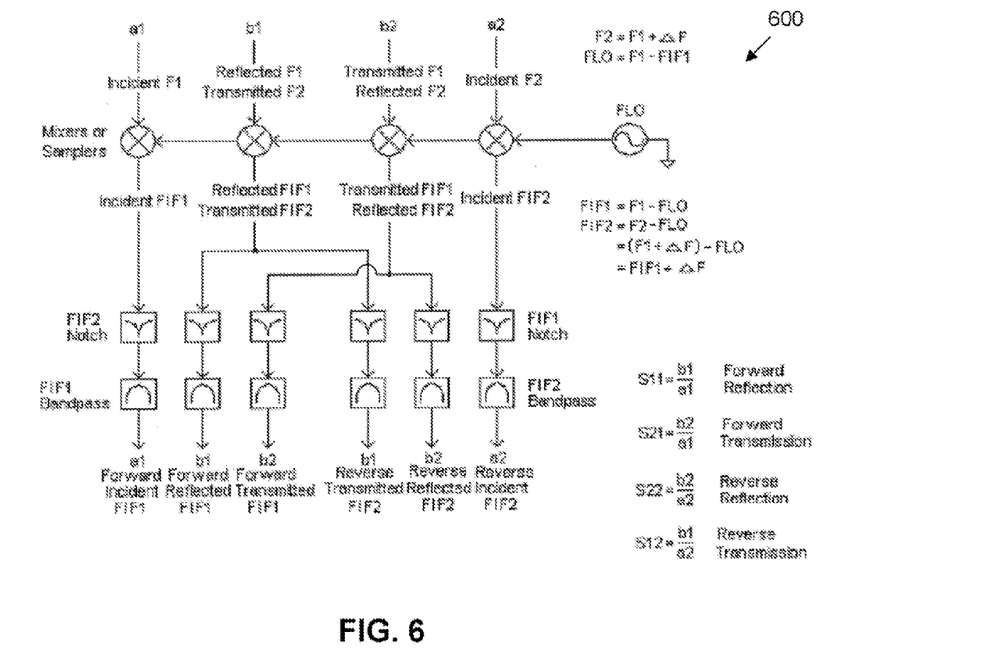
FIG. 6 illustrates separation of signals obtained in the system of FIG. 5 after downconversion.
Figure 7:
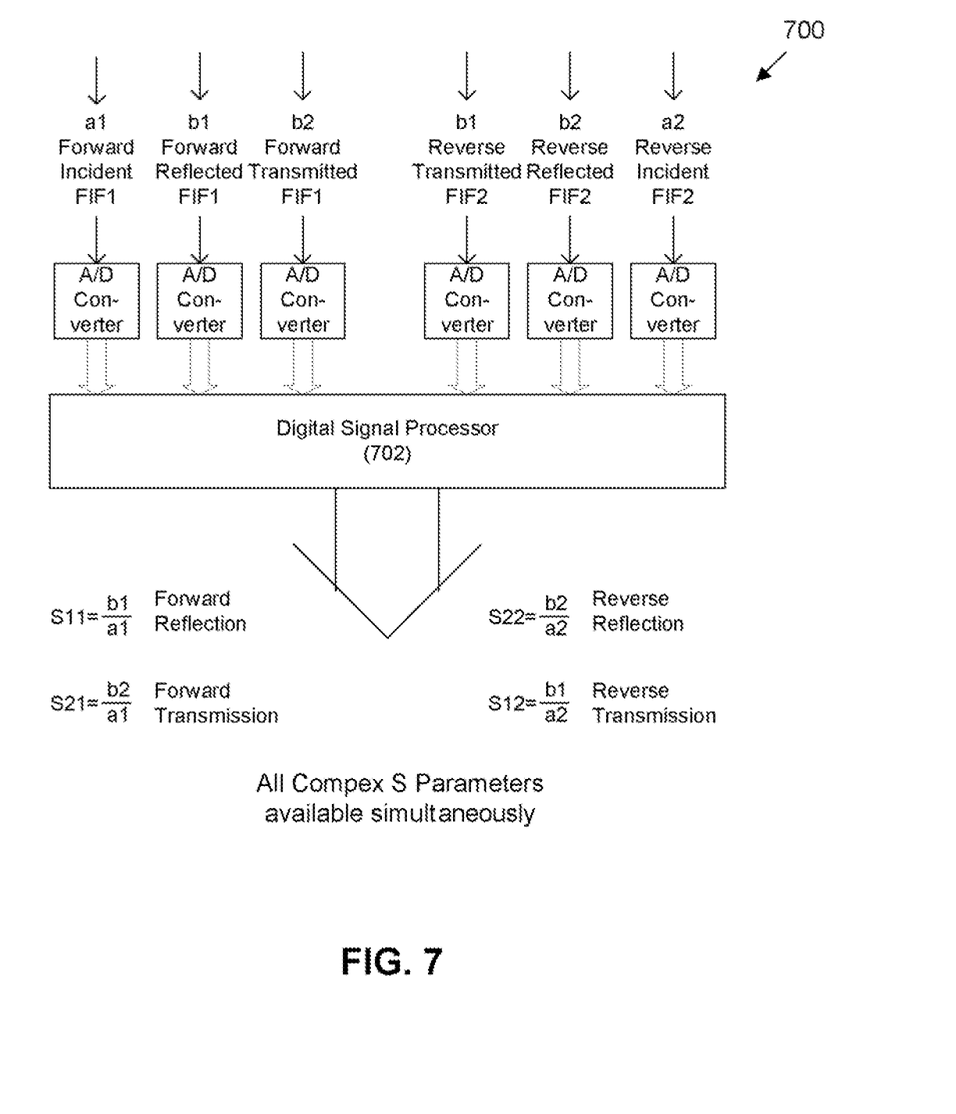
FIG. 7 illustrates digital filtering of the downconverted signals of FIG. 6.

FIGS. 6 and 7 illustrate how the signals are separated after downconversion. FIG. 6 illustrates a measurement stage 600 including downconversion through mixers or samplers can preserve the separated-in-frequency forward and reverse parameters. As can be seen, coupled signals a1, b1, b2 and a2 are downconverted using a local oscillator signal. Filters then separate the downconverted signals for the forward and reverse parameters. FIG. 7 illustrates how the separated, downconverted and filtered signals are processed simultaneously in a digital processing stage 700. Digital processing is achieved by way of a digital signal processor (702) that receives signals converted via an analog-to-digital (A/D) converter and performs the complex divide necessary for S-parameter computation. It is noted that the downconverted and filtered signals need not be processed by a digital signal processor, and this is merely provided as an example. In other embodiments, downconverted and filtered signals can be analyzed using some other processing hardware, software, or combination of hardware and software.

Figure 8:
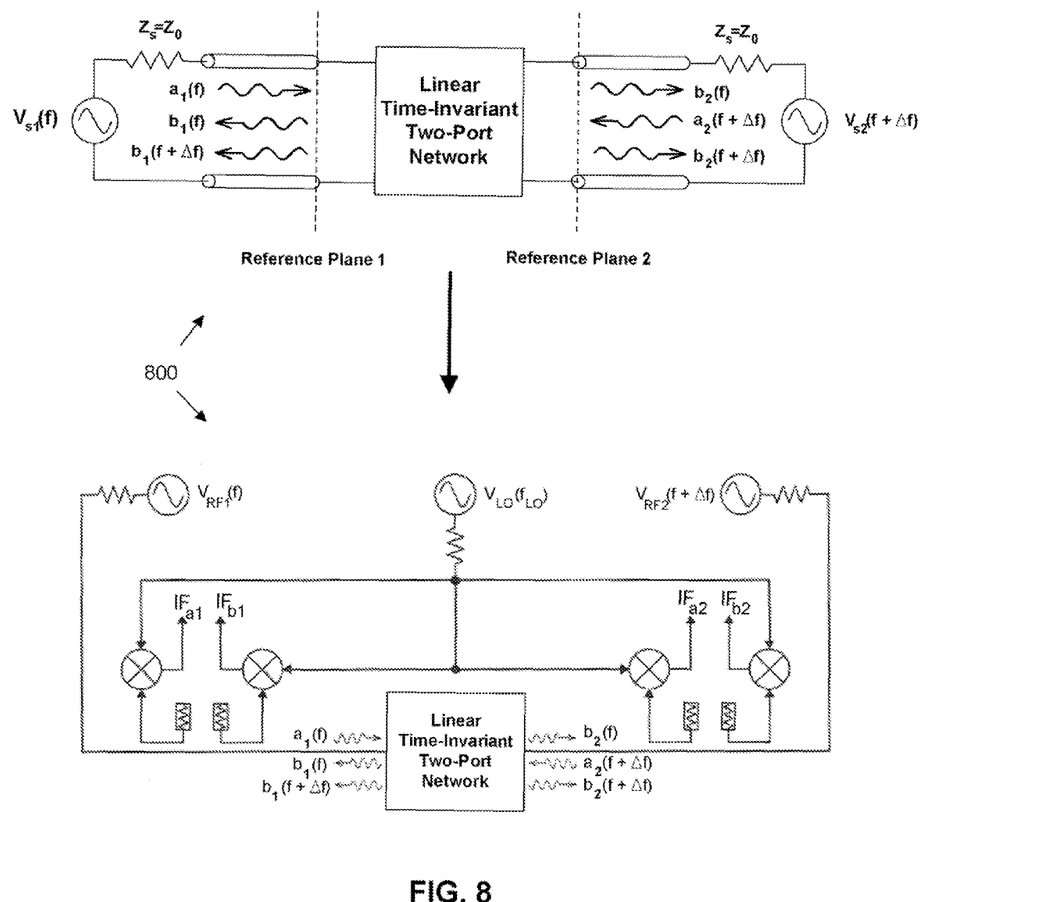
FIG. 8 is a block diagram showing circuitry for the embodiment of FIG. 5.

FIG. 8 illustrate an alternative embodiment of a system 800 represented using a different circuit diagram from that shown in FIG. 5. FIG. 8 includes the downconversion of transmitted (b2, b1), reflected, and incident signals coupled to the system using a common LO signal generated by a signal source $V_{LO}$.

Figure 9:
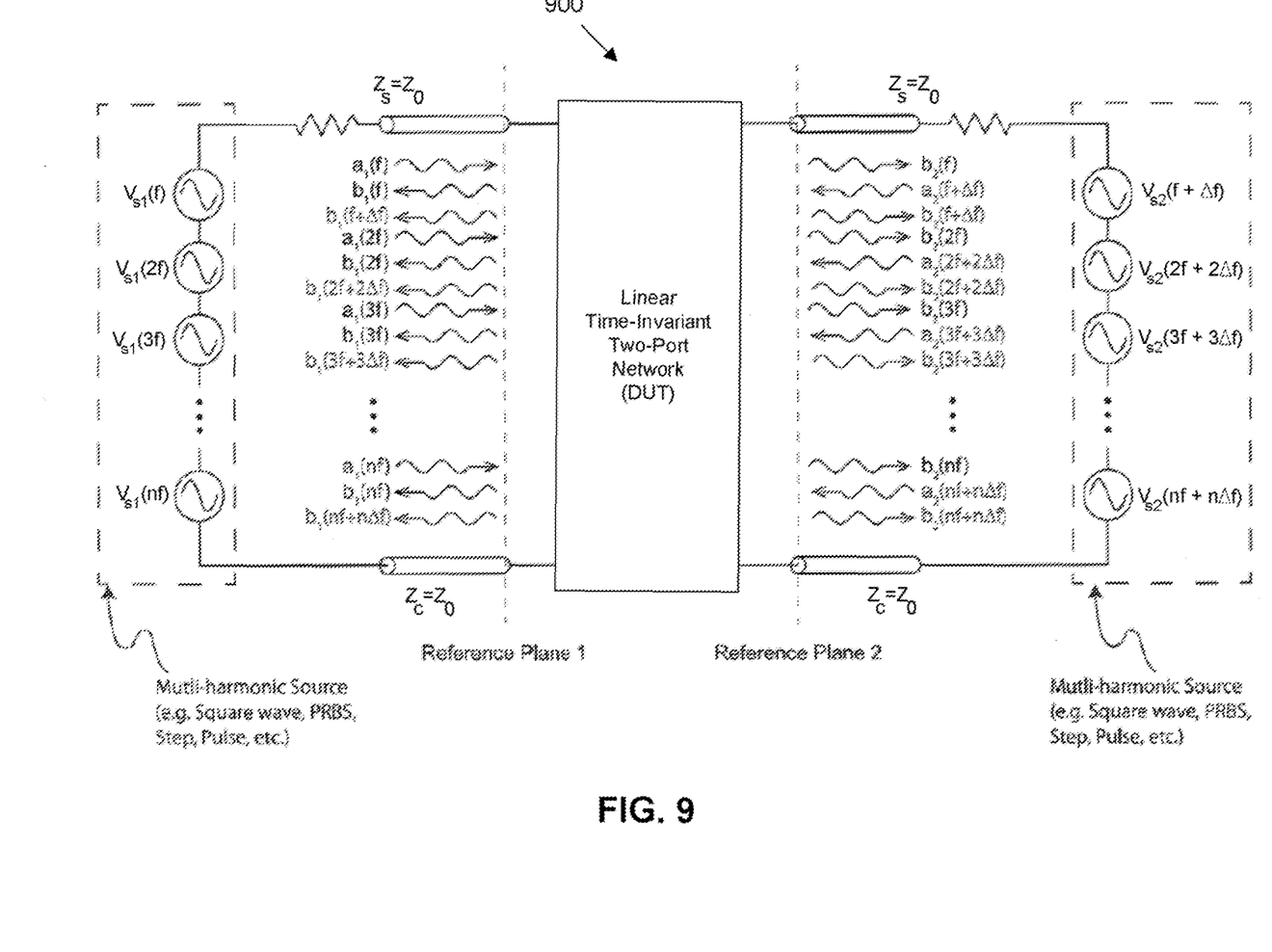
FIG. 9 is a block diagram of a system for measuring scattering parameters across multiple harmonics in accordance with an embodiment.

Referring to FIG. 9, an embodiment of a system 900 is shown for simultaneous measurement of forward and reverse S-parameters in a DUT at multiple harmonics. The system comprises a linear, time-invariant, two-port network excited simultaneously by periodic, multi-harmonic sources. Network linearity allows application of the superposition principle, and thus extraction of the network parameters at all harmonics.

Figure 10:
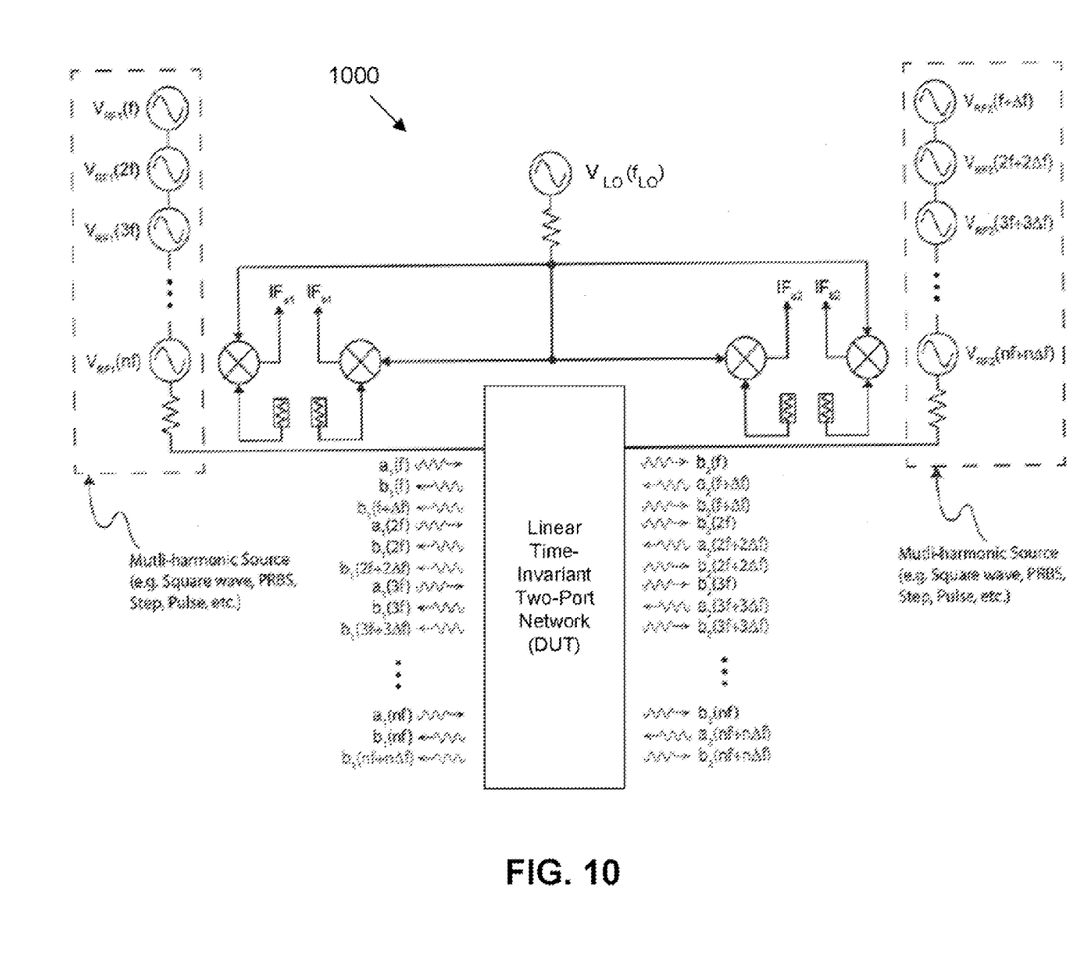
FIG. 10 is a block diagram showing circuitry for the embodiment of FIG. 9.

FIG. 10 illustrates a circuit analog of the embodiment of FIG. 9 for simultaneous measurement of forward and reverse S-parameters in a DUT at multiple harmonics. The system 1000 comprises a linear, time-invariant, two-port network whose port parameters are measured simultaneously via reflectometers. Measurement time is inversely proportional to the total number of source harmonics. The local oscillator (LO) and multi-harmonic radio frequency (RF) sources are synchronous. RF switches are absent. The down-converted IF signals are multi-harmonic and undergo filtering and digitization, followed by post-processing, for example as described above in regards to FIGS. 6 and 7.

Figure 3:
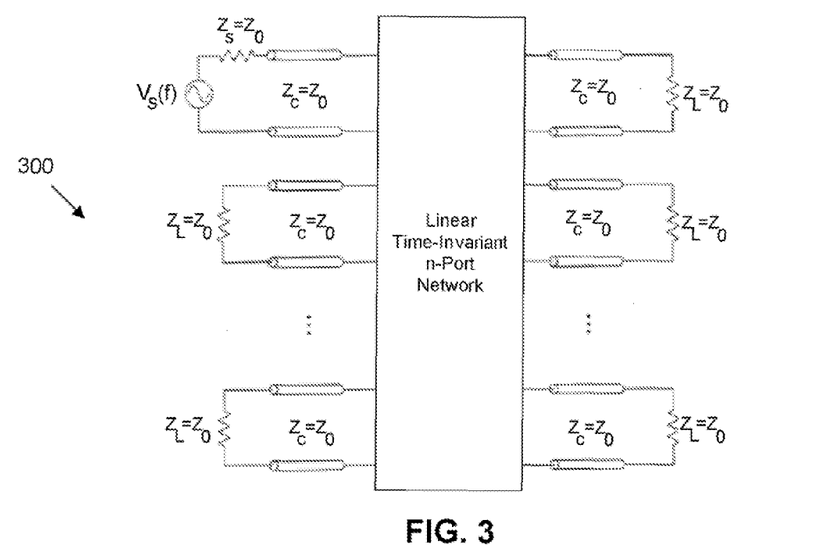
FIG. 3 is a block diagram of a vector network analyzer circuit for measuring network parameters across multiple ports.

Referring back to FIG. 3, a system 300 is shown for calculating network parameters for a linear, time-invariant, n-port network. Partial network parameters are measured by applying a sinusoidal source ($V_s$) at the $i^{th}$ port while terminating all other ports in a reference impedance. This process is applied to all n ports until all network parameters are measured. A complex matrix of switches is required to carry out the measurements.

Figure 4:
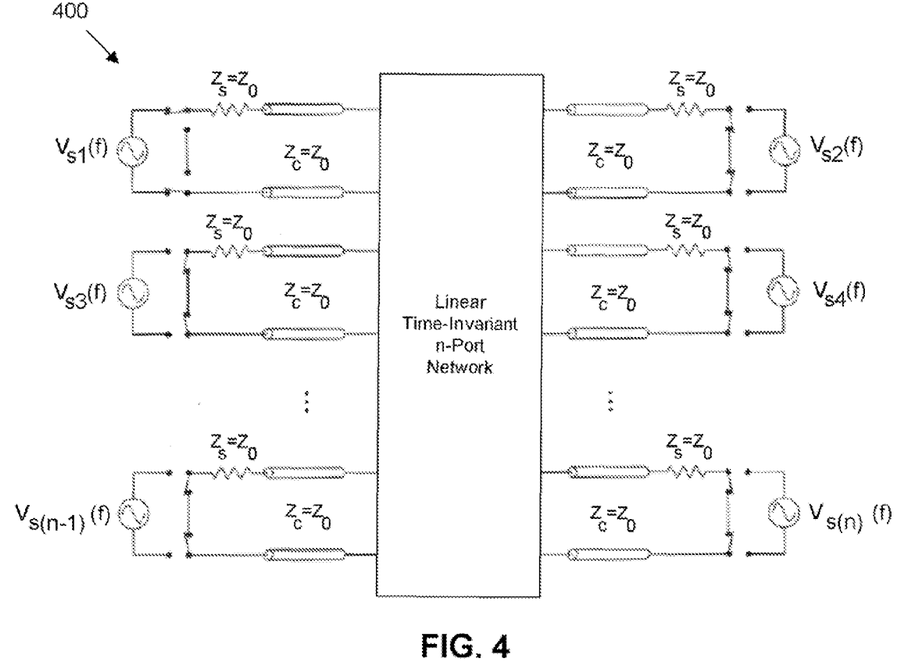
FIG. 4 is another block diagram of a vector network analyzer circuit for measuring network parameters across multiple ports.

Referring to FIG. 4, another system 400 is shown for calculating the network parameters of a linear, time-invariant, n-port network. Partial network parameters are measured by applying a sinusoidal source at the $i^{th}$ port while terminating all other ports in a reference impedance. This process is applied to all n ports until all network parameters are measured. A complex matrix of switches is required to carry out the measurements.

Figure 11:
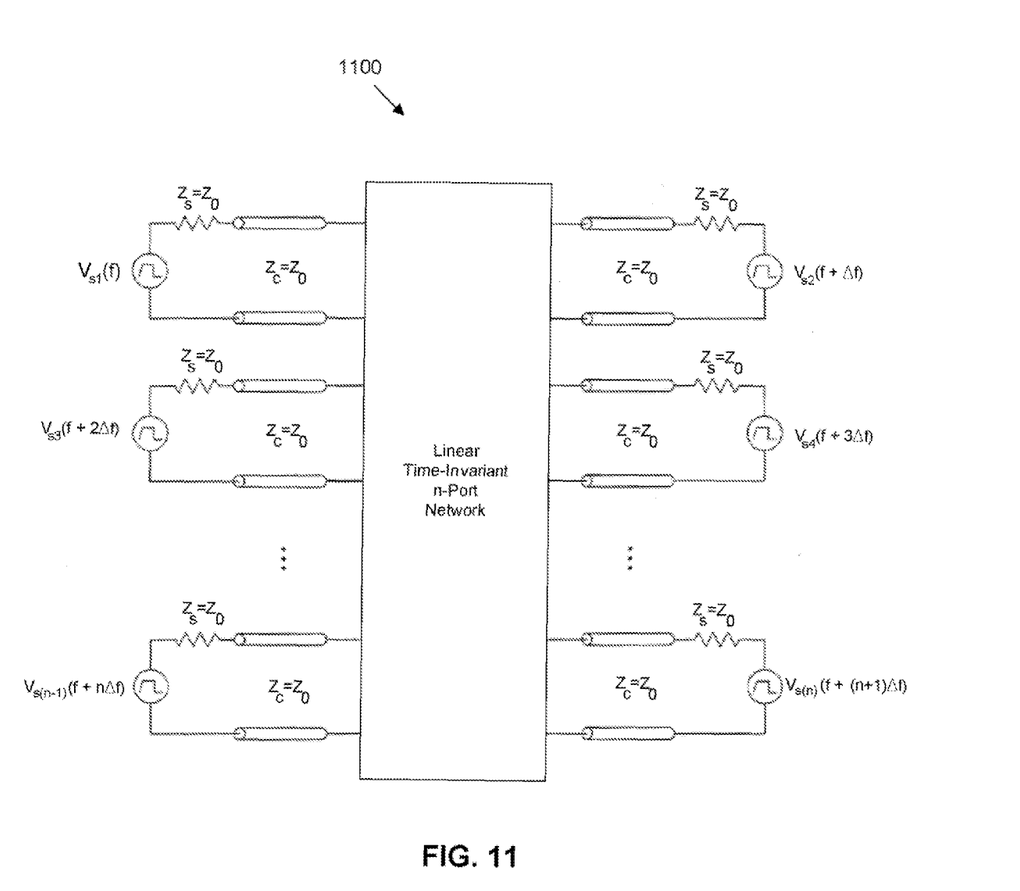
FIG. 11 is a block diagram of a system for measuring scattering parameters for n ports across multiple harmonics in accordance with an embodiment.

Referring to FIG. 11, an embodiment of a system 1100 is shown for simultaneous measurement of forward and reverse S-parameters in a DUT at multiple ports, as well as multiple harmonics. A plurality of sources is connectable to one or more ports of the DUT. The system comprises a linear, time-invariant, n-port network excited simultaneously by periodic multi-harmonic sources in accordance with this invention. The embodiment is similar to the embodiment of FIG. 9, but with n-ports. Measurement time is inversely proportional to the total number of source harmonics. Network linearity allows application of the superposition principle, and thus extraction of the network parameters at all harmonics.

Figure 12:
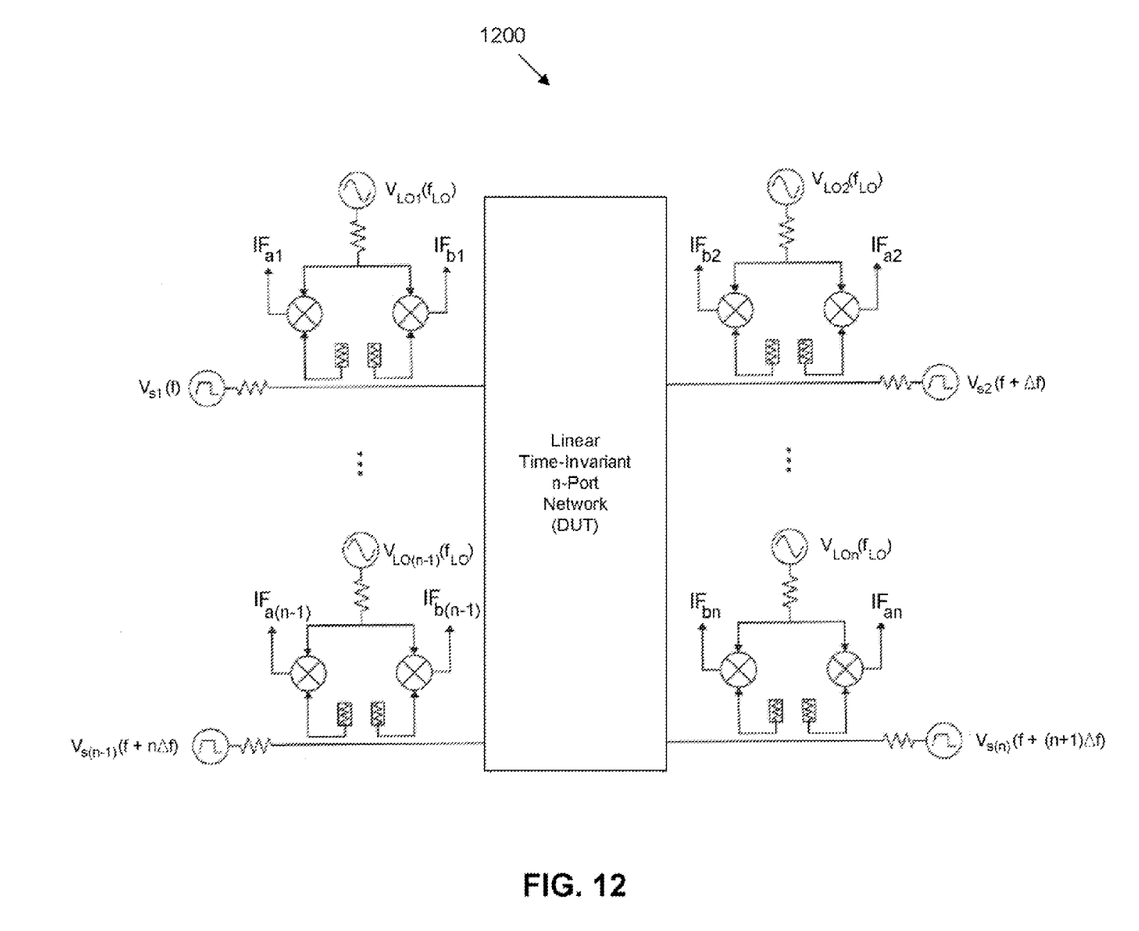
FIG. 12 is a block diagram showing circuitry for the embodiment of FIG. 11.

FIG. 12 illustrates a system 1200 that comprises a circuit analog of the embodiment of FIG. 11 for simultaneous measurement of forward and reverse S-parameters in a DUT at multiple harmonics. The system measures a linear, time-invariant, n-port network whose port parameters are measured simultaneously via reflectometers. Measurement time is inversely proportional to the total number of source harmonics. The LO and multi-harmonic RF signal sources are synchronous. Signal switches are absent. The down-converted IF signals are multi-harmonic and undergo filtering and digitization, followed by post-processing, for example as described above in regards to FIGS. 6 and 7.

Figure 13:
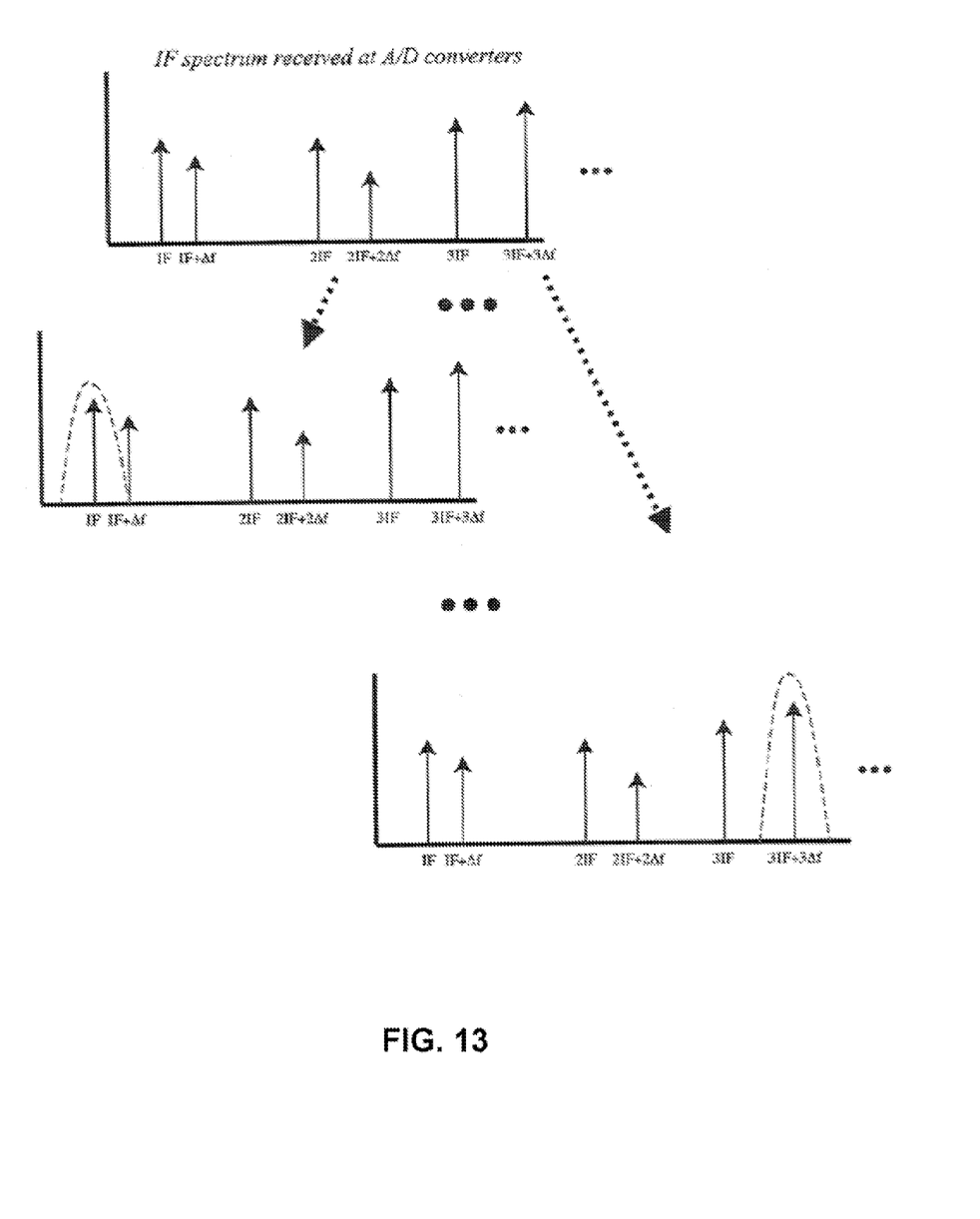
FIG. 13 illustrates a technique for filtering in accordance with an embodiment.

FIG. 13 illustrates an embodiment of the general filtering and digitization applied to the down-converted, multi-harmonic, intermediate frequency (IF) signals. The IF spectrum is shown being received at analog-to-digital converters (ADC). Effective filtering is applied in turn to each tone of interest. The filtering can be done digitally or via analog techniques. The transform with that filter applied generates the wave parameter of that channel and frequency index. In a digital context, all tones can be processed in one transform pass resulting in very high speed.

Figure 14:
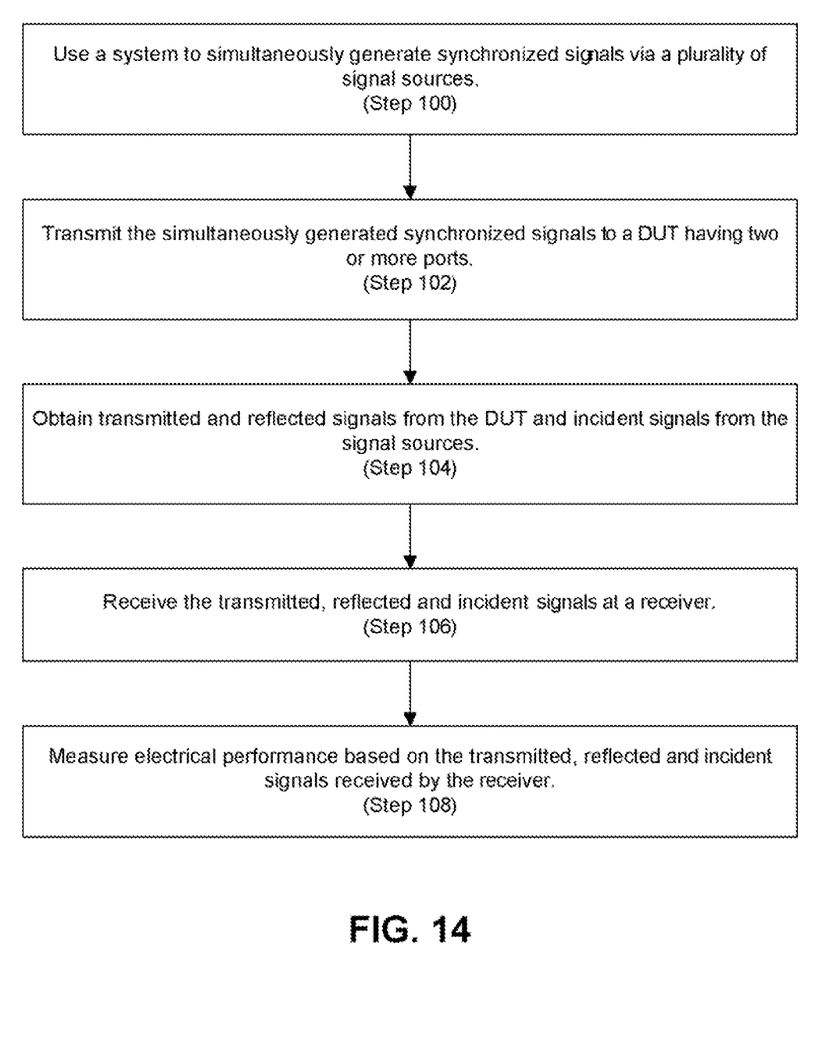
FIG. 14 is a flowchart for a method for measuring electrical performance of a DUT having two or more ports.

FIG. 14 is a flowchart for an embodiment of a method for measuring electrical performance of a DUT having two or more ports. The method uses a system for example as described above to simultaneously generate synchronized signals via a plurality of signal sources (Step 100). Each synchronized signal has a frequency offset from each of the others of the synchronized signals by a known frequency delta. The simultaneously generated synchronized signals are transmitted to the DUT (Step 102). Transmitted and reflected signals from the DUT and incident signals from the signal sources are obtained (Step 104) and received at a receiver (Step 106). Electrical performance is measured based on the transmitted, reflected and incident signals received by the receiver (Step 108). In embodiments, the method uses signal sources configured to generate multi-harmonic signals and steps through multiple harmonics of signals generated by the signal sources. The stepping through is synchronized across the signal source.

Embodiments of the present invention can provide a port-scalable, fast-measuring system for characterizing linear, multi-port networks. The system can be synchronized simultaneous multi-harmonic stimuli at all ports. The system can use a post-processor, including parallel-processing capability (i.e. multi-core, GPU accelerated, etc.). Embodiments can be used with modular multi-port instruments. Embodiments can be used in differential multi-port measurements. Embodiments can be used in the measurement of interconnects, cables, connectors, printed-circuit boards, etc. Embodiments can be used for multi-port antenna measurements (MIMO).

In some embodiments, the present invention includes a computer program product which is a non-transitory storage medium or computer readable medium (media) having instructions stored thereon/in which can be used to program a computer to perform any of the processes of the present invention. Examples of the storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing description of embodiments of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated.

The invention claimed is:

1. A system adapted to measure electrical performance of a device under test (DUT) having two or more ports, comprising:
   a plurality of signal sources, wherein each signal source is connectable with an associated port of the two or more ports of the DUT;
   wherein the signal sources are synchronized and configured to generate signals simultaneously;
   wherein the signal sources are configured to each generate a signal having a frequency offset from each of the others of the signal sources by a known frequency delta;
   a plurality of first signal paths, wherein each first signal path is connectable with an associated port for obtaining reflected and transmitted signals simultaneously received from the DUT at the associated port;
   a plurality of second signal paths, wherein each second signal path is connectable with an associated port for obtaining incident signals received from the signal source connected with the associated port;
   a receiver for receiving the reflected, transmitted and incident signals obtained at the first signal paths and the second signal paths; and
   wherein the receiver is adapted to separate the reflected and the transmitted signals obtained from each of the first signal paths.

2. The system of claim 1,
   wherein each of the signal sources is a multi-harmonic signal source adapted to step through multiple harmonics when generating a signal; and
   wherein the stepping through of the multiple harmonics of the signal sources is synchronized.

3. The system of claim 2 further comprising a signal processor; and
   wherein the signal processor is configured to calculate scattering parameters from the reflected, transmitted and incident signals received by the receiver for each of the multiple harmonics stepped through.

4. The system of claim 1 further comprising a signal processor configured to calculate scattering parameters from the reflected, transmitted and incident signals received by the receiver.

5. The system of claim 4, wherein the signal processor is a digital signal processor, and further comprising:
   an analog-to-digital convertor for converting each of the reflected, transmitted and incident signals received by the receiver for processing by the digital signal processor.

6. The system of claim 5, wherein the digital signal processor is configured to simultaneously calculate scattering parameters via parallel processing.

7. The system of claim 1, wherein the receiver includes a downconversion stage and a filter stage;
   wherein the reflected signals and the transmitted signals are separated in the filter stage.

8. The system of claim 7, wherein the downconversion stage includes a mixer for each of the first and the second signal paths.

9. The system of claim 8, wherein the downconversion stage includes
   a plurality of local oscillators, wherein each local oscillator is associated with the first signal path and the second signal path associated with a port of the two or more ports of the DUT.

10. The system of claim 1, adapted to generate, based on reflected, transmitted and incident signals received from the two or more ports, one or more of:
    a scattering parameters,
    one or more eye diagrams,
    rise and fall time measurements,
    deterministic jitter measurements,
    compliance with a given eye mask, and
    approximate bit-error rate (BER) estimated from an eye diagram.

11. A method for measuring electrical performance of a device under test (DUT) having two or more ports, comprising:
    using a system including
       a plurality of signal sources each connectable with an associated port of the two or more ports of the DUT,
       a plurality of first signal paths each connectable with an associated port for obtaining reflected and transmitted signals simultaneously received from the DUT at the associated port,
       a plurality of second signal paths each connectable with an associated port for obtaining incident signals received from the signal source connected with the associated port, and
       a receiver for receiving the reflected, transmitted and incident signals obtained at the first signal paths and the second signal paths;
    simultaneously generating synchronized signals via the plurality of signal sources;
    wherein each synchronized signal has a frequency offset from each of the others of the synchronized signals by a known frequency delta;
    transmitting the simultaneously generated synchronized signals to the DUT;
    obtaining transmitted and reflected signals from the DUT via the first signal paths;
    obtaining incident signals from the signal sources via the second signal paths;
    receiving the transmitted, reflected and incident signals at the receiver; and measuring electrical performance based on the transmitted, reflected and incident signals received by the receiver.

12. The method of claim 11, wherein each of the signal sources is a multi-harmonic signal source adapted to step through multiple harmonics when generating a signal; and further comprising:
stepping through multiple harmonics of signals generated by the signal sources;
wherein the stepping through is synchronized across the signal source.

13. The method of claim 11, further comprising:
calculating, via a signal processor, scattering parameters from the reflected, transmitted and incident signals received by the receiver.

14. The method of claim 13, wherein the signal processor is a digital signal processor, and further comprising:
converting, via an analog-to-digital convertor, each of the reflected, transmitted and incident signals received by the receiver for processing by the digital signal processor.

15. The method of claim 14, further comprising:
simultaneously calculating, via parallel processing, scattering parameters from the reflected, transmitted and incident signals received by the receiver.

16. The method of claim 11, wherein the receiver includes a downconversion stage and a filter stage; and further comprising:
separating simultaneously received reflected signals and the transmitted signals via the filter stage.

17. The method of claim 11, wherein the signal sources generated radio frequency (RF) signals, and further comprising:
downconverting each of the obtained transmitted, reflected and incident signals to an intermediate frequency.

18. The method of claim 11, further comprising:
generating, based on reflected, transmitted and incident signals received from the two or more ports, one or more of:
a scattering parameters,
one or more eye diagrams,
rise and fall time measurements,
deterministic jitter measurements,
compliance with a given eye mask, and
approximate bit-error rate (BER) estimated from an eye diagram.

19. A non-transitory computer readable storage medium, including instructions stored thereon which when read and executed by one or more computers cause the one or more computers to perform the steps comprising:
use a system including
a plurality of signal sources each connectable with an associated port of the two or more ports of the DUT,
a plurality of first signal paths each connectable with an associated port for obtaining reflected and transmitted signals simultaneously received from the DUT at the associated port,
a plurality of second signal paths each connectable with an associated port for obtaining incident signals received from the signal source connected with the associated port, and
a receiver for receiving the reflected, transmitted and incident signals obtained at the first signal paths and the second signal paths;
simultaneously generate synchronized signals via the plurality of signal sources;
wherein each synchronized signal has a frequency offset from each of the others of the synchronized signals by a known frequency delta;
transmit the simultaneously generated synchronized signals to the DUT;
obtain transmitted and reflected signals from the DUT via the first signal paths;
obtain incident signals from the signal sources via the second signal paths;
receive the transmitted, reflected and incident signals at the receiver; and
measure electrical performance based on the transmitted, reflected and incident signals received by the receiver.

20. The non-transitory computer readable storage medium of claim 19, wherein each of the signal sources is a multi-harmonic signal source adapted to step through multiple harmonics when generating a signal; and
further including instructions stored thereon which when read and executed by one or more computers cause the one or more computers to perform the steps comprising:
step through multiple harmonics of signals generated by the signal sources;
wherein the stepping through is synchronized across the signal source.

* * * * *